(12) United States Patent
Xiao et al.

(10) Patent No.: US 8,765,223 B2
(45) Date of Patent: *Jul. 1, 2014

(54) BINARY AND TERNARY METAL CHALCOGENIDE MATERIALS AND METHOD OF MAKING AND USING SAME

(75) Inventors: Manchao Xiao, San Diego, CA (US); Liu Yang, Yorba Linda, CA (US)

(73) Assignee: Air Products and Chemicals, Inc., Allentown, PA (US)

(*) Notice: Subject to any disclaimer, the term of this patent is extended or adjusted under 35 U.S.C. 154(b) by 479 days.

This patent is subject to a terminal disclaimer.

(21) Appl. No.: 12/425,821

(22) Filed: Apr. 17, 2009

(65) Prior Publication Data

US 2009/0280052 A1    Nov. 12, 2009

Related U.S. Application Data

(60) Provisional application No. 61/051,403, filed on May 8, 2008.

(51) Int. Cl.
| | |
|---|---|
| C01B 19/00 | (2006.01) |
| C23C 16/08 | (2006.01) |
| C23C 16/16 | (2006.01) |
| C23C 16/18 | (2006.01) |
| C07F 7/08 | (2006.01) |
| C07F 7/30 | (2006.01) |

(52) U.S. Cl.
USPC ............. 427/255.35; 427/250; 427/255.28; 427/255.31; 423/508; 438/95; 438/102

(58) Field of Classification Search
USPC ............. 427/250, 255.2, 8, 255.31, 2, 55.33; 423/508; 438/95, 102
See application file for complete search history.

(56) References Cited

U.S. PATENT DOCUMENTS

| | | | |
|---|---|---|---|
| 5,312,983 A | 5/1994 | Brown et al. | |
| 6,958,277 B2 * | 10/2005 | Pomarede et al. | 438/287 |
| 7,060,243 B2 | 6/2006 | Bawendi et al. | |
| 7,390,568 B2 | 6/2008 | Kim et al. | |
| 7,678,422 B2 * | 3/2010 | Lei et al. | 427/255.29 |
| 7,902,048 B2 * | 3/2011 | Shin et al. | 438/483 |
| 7,960,205 B2 * | 6/2011 | Xiao et al. | 438/95 |

(Continued)

FOREIGN PATENT DOCUMENTS

| | | |
|---|---|---|
| CN | 101165934 A | 4/2008 |
| EP | 2 067 876 A2 | 6/2009 |

(Continued)

OTHER PUBLICATIONS

H. Burger, et al, Disilyltellurid, Inorg. Nucl. Chem. Letters, 1967, 549-552, 3.

(Continued)

*Primary Examiner* — Dennis Cordray
(74) *Attorney, Agent, or Firm* — Rosaleen P. Morris-Oskanian; Lina Yang

(57) ABSTRACT

This invention discloses the synthesis of metal chalcogenides using chemical vapor deposition (CVD) process, atomic layer deposition (ALD) process, or wet solution process. Ligand exchange reactions of organosilyltellurium or organosilylselenium with a series of metal compounds having neucleophilic substituents generate metal chalcogenides. This chemistry is used to deposit germanium-antimony-tellurium (GeSbTe) and germanium-antimony-selenium (GeSbSe) films or other tellurium and selenium based metal compounds for phase change memory and photovoltaic devices.

24 Claims, 10 Drawing Sheets

TGA/DSC of Bis(trimethylsilyl)tellurium

(56) References Cited

U.S. PATENT DOCUMENTS

| | | | |
|---|---|---|---|
| 8,193,027 B2* | 6/2012 | Xiao et al. | 438/84 |
| 2003/0206590 A1 | 11/2003 | Krishnamachari | |
| 2004/0023998 A1 | 2/2004 | Kojima et al. | |
| 2004/0030873 A1 | 2/2004 | Park et al. | |
| 2004/0120303 A1 | 6/2004 | Kloos et al. | |
| 2004/0144338 A1 | 7/2004 | Goldman | |
| 2004/0241556 A1* | 12/2004 | Bellman et al. | 430/5 |
| 2005/0085533 A1 | 4/2005 | Medaer et al. | |
| 2006/0049447 A1 | 3/2006 | Lee et al. | |
| 2006/0057637 A1 | 3/2006 | Anderson et al. | |
| 2006/0067418 A1 | 3/2006 | Girardeau, Jr. et al. | |
| 2006/0172083 A1 | 8/2006 | Lee et al. | |
| 2006/0180811 A1 | 8/2006 | Lee et al. | |
| 2006/0182885 A1 | 8/2006 | Lei et al. | |
| 2006/0196375 A1 | 9/2006 | Coe-Sullivan et al. | |
| 2007/0071062 A1 | 3/2007 | Eisler et al. | |
| 2007/0103068 A1 | 5/2007 | Bawendi et al. | |
| 2007/0152236 A1 | 7/2007 | Halpert et al. | |
| 2007/0160838 A1 | 7/2007 | Bawendi et al. | |
| 2007/0197003 A1 | 8/2007 | Yen et al. | |
| 2008/0108175 A1 | 5/2008 | Shin et al. | |
| 2009/0097305 A1 | 4/2009 | Bae et al. | |
| 2009/0112009 A1 | 4/2009 | Chen et al. | |
| 2009/0124039 A1 | 5/2009 | Roeder et al. | |
| 2009/0305458 A1* | 12/2009 | Hunks et al. | 438/102 |
| 2010/0009078 A1* | 1/2010 | Pore et al. | 427/255.28 |

FOREIGN PATENT DOCUMENTS

| | | |
|---|---|---|
| EP | 2 130 942 A2 | 12/2009 |
| JP | 55-130805 A2 | 10/1980 |
| JP | 08-024626 A | 1/1996 |
| JP | 08024626 | 3/1996 |
| JP | 2006-508012 A | 3/2006 |
| JP | 2006-214005 A2 | 8/2006 |
| JP | 2006-225390 A | 8/2006 |
| JP | 2006-225390 A2 | 8/2006 |
| JP | 2006-225764 A | 8/2006 |
| JP | 2006-225764 A2 | 8/2006 |
| JP | 2009-536986 A | 10/2009 |
| WO | 2007/133837 A2 | 11/2007 |
| WO | WO 2007133837 A2 * | 11/2007 |
| WO | WO 2008/057616 A2 * | 5/2008 |

OTHER PUBLICATIONS

M. Detty, et al, Bis(trialkylsilyl) Chalcogenides. 1. Preparation and Reduction of Group 6A Oxides, J. Org. Chem., 1982, 1354-1356, 47.

R.S. Dickson, et al, The assessment of some Sb-Te single-source compounds for MOCVD applications, J. Organometal. Chem., 1995, 189-197, 493.

B.J. Choi, et al, Cyclic PECVD of Ge2Sb2Te5 Films Using Metal-lorganic Sources, Journal of the Electrochemical Society, 2007, H318-H324, 154.

S. Kim, et al, InAsxSb1-x alloy nanocrystals for use in the near infrared, Chem. Commun., 2006, 4811-4813.

S. Schulz, et al, Synthesis and characterization of organogallium-antimony compounds, Journal of Organometallic Chemistry, 1998, 275-278, 570.

J.E. Drake, et al, Silyl and Germyl Selenides and Tellurides, Inorganic Syntheses, 1980, 171-174, 20.

T. J. Groshens, et al, Room-Temperature MOCVD of Sb2Te3 Films and Solution Precipitation of M2Te3 (M=Sb, Bi) Powders via a Novel (N,N-Dimethylamino)trimethylsilane Elimination Reaction, American Chemical Society, 1994, 727-729.

B.J. Choi, et al, Combined Atomic Layer and Chemical Vapor Deposition, and Selective Growth of Ge2Sb2Te5 Films on TiN/W Contact Plug, American Chemical Society, 2007.

M. N. Bochkarev, et al, Organoelemental Chalcogenides, Zhurnal Obshchey Khimii, 1968, 135-141, 39.

* cited by examiner

TGA/DSC of Bis(trimethylsilyl)tellurium

SEM picture of GeTe sample

EDX of GeTe sample

SEM picture of SbTe sample

EDX of SbTe sample

SEM picture of GeSbTe sample

EDX of GeSbTe sample

EDX spectrum of an ALD GeTe film

EDX spectrum of an ALD SbTe film

EDX spectrum of an ALD GeSbTe film

BINARY AND TERNARY METAL CHALCOGENIDE MATERIALS AND METHOD OF MAKING AND USING SAME

CROSS REFERENCE TO RELATED APPLICATION

This patent application claims the benefit of U.S. Provisional Patent Application Ser. No. 61/051,403, filed 8 May 2008.

BACKGROUND OF THE INVENTION

Binary, ternary, and quaternary metal chalcogenides have been using as phase change and photovoltaic materials.

Phase-change materials exist in a crystalline state or an amorphous state according to temperature. A phase-change material has a more ordered atomic arrangement and a lower electrical resistance in a crystalline state than in an amorphous state. A phase-change material can be reversibly transformed from the crystalline state to the amorphous state based on an operating temperature. Such characteristics, that is, reversible phase change and different resistances of different states, are applied to newly proposed electronic devices, a new type of nonvolatile memory devices, phase-change random access memory (PRAM) devices. The electrical resistance of a PRAM may vary based on a state (e.g., crystalline, amorphous, etc.) of a phase-change material included therein.

Among various types of phase-change materials used for memory devices, the most commonly used are ternary chalcogenides of group 14 and group 15 elements, such as germanium-antimony-tellurium compounds ($Ge_2Sb_2Te_5$), or commonly abbreviated as GST. The solid phases of GST can rapidly change from crystalline state to amorphous state or vise versa upon heating and cooling cycles. The amorphous GST has relatively higher electrical resistance while the crystalline GST has relatively lower electrical resistance.

Previous arts include the manufacturing of bulk metal chalcogenide phase change materials with metallurgical methods and thin film materials with Physical Vapor Deposition (PVD), chemical vapor deposition (CVD) or atomic layer deposition (ALD) processes. Examples of works in the field are listed below.

Berger, H.; Goetze, U. discloses the preparation of disilyltellurides; *Inorg. Nucl. Chem. Lett.* 1967, 3, 549-552. Detty, Michael R.; Seidler, Mark D., discloses the synthesis of bis (trialkylsilyl)chalcogenides; Journal of Organic Chemistry (1982), 47(7), 1354-6. Dickson, R. S., Heazle, K. D., discloses the assessment of some Sb—Te single-source compounds for MOCVD applications; J. Organometal. Chem., 493 (1995) 189-197. Choi, B. J., et al, discloses the deposition of Ge2Sb2Te5 films in cyclic PECVD process using metal-lorganic precursors; J. Electrochemical Soc., 154 H318-H324 (2007). Jung-Hyun Lee et al, discloses the making of GST films from aminogermanes, aminostilbines, and dialkyltellurium; US 2006 0172083 A1; discloses the tellurium precursors for GST films; US 2006 0180811; and discloses the antimony precursor for GST films; US 2006 0049447. Duncan W. Rown et al, discloses the use of organometallic tellurium compounds using fluorinated alkyl tellurium compounds in CVD process; U.S. Pat. No. 5,312,983. Moungi G. Bawendi et al, discloses the tellurium-containing nanocrystalline materials produced by injection of a precursor into a hot coordinating solvent, followed by controlled growth and annealing; U.S. Pat. No. 7,060,243 B2.

One of the technical hurdles in designing PRAM cell is that in order to overcome the heat dissipation during the switching of GST materials from crystalline to amorphous states a high level of reset current has to be applied. This heat dissipation, however, can be greatly reduced by confining GST material into contact plugs, thus reducing the reset current needed for the action. Since the GST contact plugs are of high aspect ratio structure, conventional sputtering process for GST film deposition can not achieve high conformality. This drives the need for precursors and related manufacturing methods or processes for forming GST films by chemical vapor deposition (CVD) or atomic layer deposition (ALD) processes, which can produce films with high conformality and chemical composition uniformity.

Similarly, the needs arises from the thin film making of a photovoltaic (PV) materials for the application such as the solar cell. A photovoltaic (PV) device absorbs light and generates electricity. The absorption of light and separation of charges happen in the active materials in a PV device. Development of efficient and low cost photovoltaic devices is key to significant utility of direct solar energy to electrical power conversion. Crystalline silicon is among the best-known semiconductors for photovoltaic devices and is widely employed. Other useful materials are thin films of amorphous silicon (a-Si), Copper Indium Selenide (CIS), Copper Gallium Delenide (CGS), Polycrystalline Copper Indium Gallium Selenide (CIGS), Cadmium telluride (CdTe), and organic material. The elements useful are cadmium, tellurium, indium, gallium, selenium, germanium and ruthenium.

BRIEF SUMMARY OF THE INVENTION

The present invention satisfies the need by providing new sets of chemistry to manufacture metal chalcogenide materials in thin film form with CVD, ALD process, or in fine particle form with wet chemistry process.

One embodiment of making a metal chalcogenide alloy film on a substrate comprises steps of:
(a) contacting the substrate with a silyl-chalcogen selected from the group consisting of silyltellurium and silylselenium; and
(b) contacting the substrate with a metal compound having a general formula of: $MX_n$;
wherein M is selected from the group consisting of Ge, Sb, In, Sn, Ga, Bi, Ag, Cu, Zr, Hf, Hg, Cd, Zn and noble metals; X is a neucleophilic group selected from the group consisting of OR(alkoxy), F (fluorine), Cl (chlorine), Br (bromine), $NR_2$ (amino), CN (cyano), OCN (cyanate), SCN (thiocyanate), diketonate, carboxylic groups and mixtures thereof; and n=1 to 5.

Another embodiment of making a metal chalcogenide alloy film on a substrate comprising steps of:
(a) contacting the substrate with a silyl-chalcogen selected from the group consisting of silyltellurium and silylselenium;
(b) contacting the substrate with a metal compound having a general formula of: $MX_n$;
wherein M is selected from the group consisting of Ge, Sb, In, Sn, Ga, Bi, Ag, Cu, Zr, Hf, Hg, Cd, Zn and noble metals; X is a neucleophilic group selected from the group consisting of OR(alkoxy), F (fluorine), Cl (chlorine), Br (bromine), $NR_2$ (amino), CN (cyano), OCN (cyanate), SCN (thiocyanate), diketonate, carboxylic groups and mixtures thereof, and n=1 to 5; and
(c) contacting the substrate with a metal compound having a general formula of: $M'X_n$;
wherein: M' is selected from the group consisting of Ge, Sb, In, Sn, Ga, Bi, Ag, Cu, Zr, Hf, Hg, Cd, Zn and noble metals;

X is a neucleophilic group selected from the group consisting of OR(alkoxy), F (fluorine), Cl (chlorine), Br (bromine), $NR_2$ (amino), CN (cyano), OCN (cyanate), SCN (thiocyanate), diketonate, carboxylic groups and mixtures thereof; n=1 to 5; and M and M' are different metals.

Another embodiment provides a silyltellurium precursor or a silylselenium precursor for making a metal chalcogenide alloy film, wherein the silyltellurium precursor is selected from the group consisting of bis-disilyltellurium having a general formula: $(R^1R^2R^3Si)_2Te$, alkylsilyltellurium having a general formula: $(R^1R^2R^3Si)TeR^4$, and mixtures thereof; wherein $R^1$, $R^2$, $R^3$, and $R^4$, are independently hydrogen, alkyl groups having 1-10 carbons in linear, branched, or cyclic forms without or with double bonds, or aromatic groups; and the silylselenium is selected from the group consisting of disilylselenium having a general formula: $(R^1R^2R^3Si)_2Se$, alkylsilylselenium having a general formula: $(R^1R^2R^3Si)SeR^4$, and mixtures thereof; wherein $R^1$, $R^2$, $R^3$, and $R^4$, are independently hydrogen, alkyl groups having 1-10 carbons in linear, branched, or cyclic forms without or with double bonds, or aromatic groups.

Yet, another embodiment provides the metal chalcogenide alloy film made by the precursors and processes from the embodiments listed above.

DETAILED DESCRIPTION OF THE INVENTION

Figure 1:
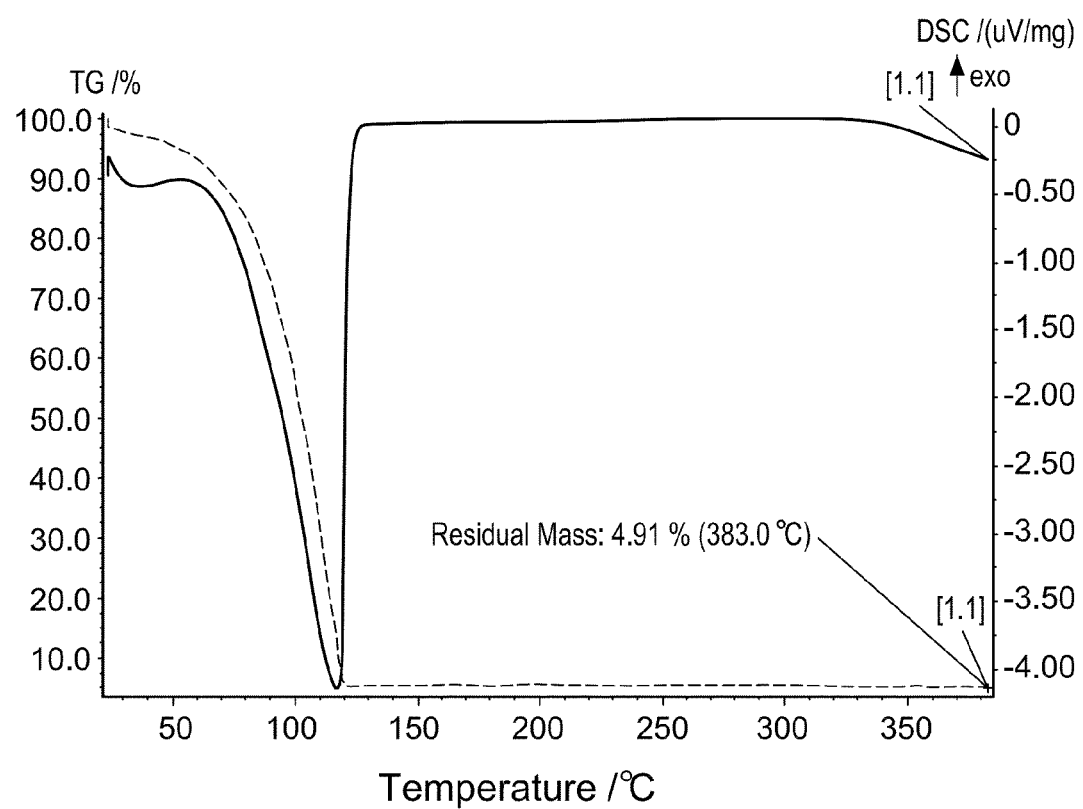
FIG. 1. Thermo-gravimetric analysis (TGA) and differential scanning calorimetry (DSC) of Bis(trimethylsilyl)tellurium.

Binary, ternary, and quaternary metal chalcogenides have been using as phase change and photovoltaic materials.

Ligand exchange reactions of silyl-chalcogens, such as organosilyltellurium or silyltellurium, organosilylselenium or silylselenium with a series of metal compounds having neucleophilic substituents generate metal chalcogenides in solution or gas phase. Binary, ternary, and multi-element metal tellurides and selenides are prepared using these methods.

Chemical vapor deposition (CVD) is a well-established chemical process for depositing thin films of various materials in the semiconductor industry, as part of the semiconductor device fabrication process. The CVD process may include but not limited to metal organic chemical vapor deposition (MOCVD), cyclic chemical vapor deposition (cyclic-CVD), Direct liquid injection CVD (DLICVD), Low-pressure CVD (LPCVD), Microwave-Enhanced CVD, and Plasma-Enhanced CVD (PECVD).

In a typical CVD process the substrate is exposed to one or more volatile precursors, which react and/or decompose on the substrate surface to produce the desired deposit. Frequently, precursors with vapor pressures insufficient for vapor draw are introduced to the reaction chamber via direct liquid injection (DLI).

CVD offers many advantages, including:

Versatile—can deposit any element or compound;

High Purity—typically 99.99-99.999%;

High Density—nearly 100% of theoretical;

Material Formation well below the melting point;

Coatings Deposited by CVD are conformal and near net shape;

Economical in production, since many parts can be coated at the same time.

Atomical Layer Deposition (ALD) is a unique modification of the chemical vapor deposition method for highly controlled deposition of thin films. It is a self-limiting (the amount of film material deposited in each reaction cycle is constant), sequential process (the precursor vapors are brought onto the substrates alternately, one at a time, separated by purging periods with inert gas). ALD is considered as one deposition method with the greatest potential for producing very thin, conformal films with control of the thickness and composition of the films possible at the atomic level. A major driving force for the recent interest is the prospective seen for ALD in scaling down microelectronic devices.

Using ALD, Film thickness depends only on the number of reaction cycles, which makes the thickness control accurate and simple. Unlike CVD, there is less need of reactant flux homogeneity, which gives large area (large batch and easy scale-up) capability, excellent conformality and reproducibility, and simplifies the use of solid precursors. Also, the growth of different multilayer structures is straight forward. These advantages make the ALD method attractive for microelectronics for manufacturing of future generation integrated circuits. Another advantage of ALD is the wide range of film materials available, and high density and low impurity level. Also, lower deposition temperature can be used in order not to affect sensitive substrates.

The present invention provides silyl-chalcogens, such as silyltellurium and silylselenium compounds as precursors for tellurium and selenium sources, which react with metal compounds having neucleophilic substituents to form metal tellurides and metal selenides. Ternary and quaternary telluride and selenide compounds can be made by adding metal compounds in a sequential manner or in a mixed manner, in a CVD or an ALD process. The material and the technologies disclosed in the present invention will be applied to the deposit ion of GST films or other metal chalcogenide compounds for phase change memory applications, and various thin films in photovoltaic devices.

Tellurium precursors can contain disilyltellurium, silyalkyltellurium, with the general structures of:

$(R^1R^2R^3Si)_2Te$, $(R^1R^2R^3Si)R^4Te$;

and Selenium precursors can contain disilylselenium, silyalkylselenium, with the general structures of:

$(R^1R^2R^3Si)_2Se$, $(R^1R^2R^3Si)R^4Se$;

where $R^1$, $R^2$, $R^3$, and $R^4$, are independently hydrogen, alkyl groups having 1-10 carbons in linear, branched, or cyclic forms without or with double bonds, or aromatic groups.

Examples for the silyltellurium precursor are including but not limited to bis(trimethylsilyl)tellurium, bis(dimethylsilyl)

tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium.

Examples for the silylselenium precursor are including but not limited to bis(trimethylsilyl)selenium, bis(dimethylsilyl)selenium, bis(triethylsilyl)selenium, bis(diethylsilyl)selenium, bis(phenyldimethylsilyl)selenium, bis(t-butyldimethylsilyl)selenium, dimethylsilylmethyl selenium, dimethylsilylphenyl selenium, dimethylsilyl-n-butyl selenium, dimethylsilyl-t-butyl selenium, trimethylsilylmethyl selenium, trimethylsilylphenyl selenium, trimethylsilyl-n-butyl selenium, and trimethylsilyl-t-butylselenium.

Metal compounds have the general formula of:

$$MX_n$$

where M is the metal selected from the periodic table of elements, including but not limited to: Ge, Sb, In, Sn, Ga, Bi, Ag, Cu, Zr, Hf, Hg, Cd, Zn and noble metals; and X is neucleophilic group such as OR(alkoxy), F (fluorine), Cl (chlorine), Br (bromine), $NR_2$ (amino), CN (cyano), OCN (cyanate), SCN (thiocyanate), diketonate, or carboxylic groups.

Examples of Ge compounds are including but not limited to:
(1) $(R^1O)_4Ge$ or $(R^1O)_n GeH_{4-n}$ where $R^1$ is an alkyl group with 1 to 10 carbons in chain, branched, cyclic, or aromatic group; and n=1 to 3;
(2) $(R^1R^2N)_4Ge$ or $(R^1R^2N)_{4-n}GeH_n$, where $R^1$ and $R^2$ are individually alkyl groups with 1 to 10 carbons in chain, branched, cyclic, or aromatic group; and n=1 to 3; and
(3) $GeX_4$, $GeX_2$, or $R_nGeX_{4-n}$, where X is F, Cl, or Br, R is hydrogen, or alkyl groups with 1 to 10 carbons in chain, branched, cyclic or aromatic groups; and n=0-3.

Examples of Sb compounds are including but not limited to:
(1) $(RO)_3Sb$, where R is an alkyl group with 1 to 10 carbons in chain, branched, or cyclic;
(2) $(R^1R^2N)_3Sb$, where $R^1$ and $R^2$ are individually alkyl groups with 1 to 10 carbons in chain, branched, or cyclic; and
(3) antimony halide with the general formula: $SbX_3$ and $SbX_5$, where X is F, Cl, or Br.

Silicon-tellurium bonds and silicon-selenium bonds are highly reactive toward neucleophilic attack due to their high degree of ionic character and low bond energy. When react with metal compound, $MX_n$, the silyl groups tend to combine with the electronegative ligands X forming stronger bonds, resulting the formation of metal-tellurium bonds and metal-selenium bonds. Study shows the chemical bond reactivity on silicon has the following order. The bond with high reactivity can be readily converted to the one with low reactivity.

The chemical bond reactivity from high activity to low activity is shown below:

Si—Te>Si—I>Si—Se>Si—S>Si—Br>Si—Cl>Si—CN>Si—NCS>Si—O>Si—F

The formation of metal telluride can be demonstrated by the following exemplary reactions $Me_3Si—Te—SiMe_3+M(OR)n \rightarrow MTe+Me_3SiOR$ $Me_3Si—Te—SiMe_3+M(F)n \rightarrow MTe+Me_3SiF$ $Me_3Si—Te—SiMe_3+M(NR_2)n \rightarrow MTe+Me_3SiNR_2$ The formation of metal selenides can be demonstrated in the similar reactions.

In particular, GST materials suitable for phase change memory devices can be generated by reactions shown below in CVD or ALD reactors $Me_3Si—Te—SiMe_3+Ge(OMe)_4+Sb(OEt)_3 \rightarrow GeSbTe+Me_3SiOEt+Me_3SiOMe$ $Me_3Si—Te—SiMe_3+GeF_4+SbF_5 \rightarrow GeSbTe+Me_3SiF$ $Me_3Si—Te—SiMe_3+Ge(NMe_2)_4+Sb(NMe_2)_3 \rightarrow GeSbTe+Me_3SiNMe_2$ where GeSbTe represents a general formula of germanium-antimony telluride compounds, wherein the ratio of three elements may differ.

ALD process of depositing GeSbTe films from silyltellurium compound and alkoxygermane and alkoxyantimony can be illustrated by the reaction scheme shown below. ALD process of depositing GeSbSe (germanium-antimony-selenium) films from silylselenium compound and alkoxygermane and alkoxyantimony can be illustrated in the similar reaction scheme.

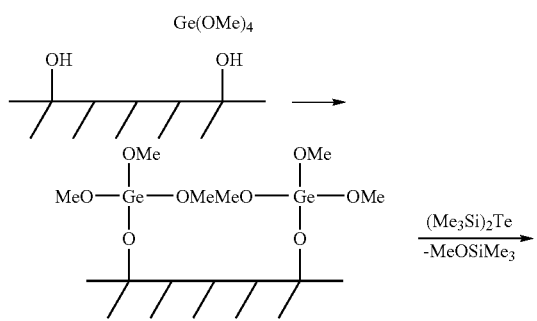

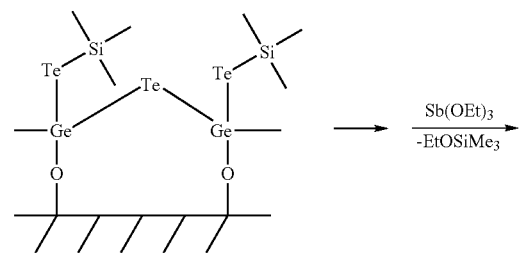

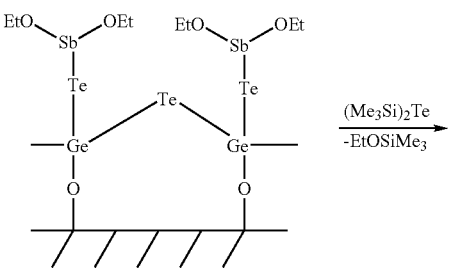

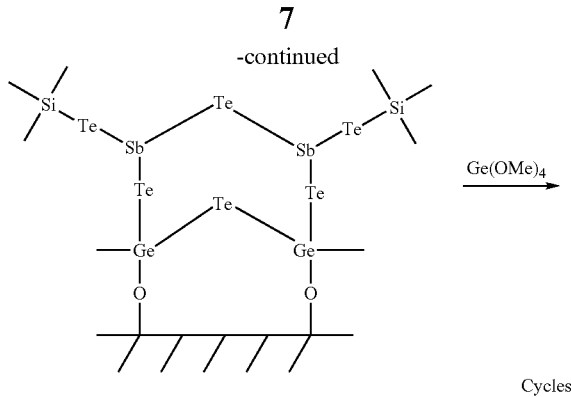

ALD is considered as a unique process used to deposit GST films or other metal chalcogenide compounds for phase change memory applications, for ALD can be applied to small dimension holes (such as the contact holes) that chemical vapor deposition (CVD) or sputtering methods cannot. The ALD process may include plasma-enhanced ALD.

In the present invention, the precursors may be provided simultaneously (e.g., CVD), sequentially (e.g., cyclic-CVD, ALD), or in any combinations during the deposition. Alternatively, the precursors may also be provided sequentially by providing a precursor and purging the unabsorbed precursor prior to providing the next precursor. Thus, a precursor that has been supplied but not absorbed may be purged.

The deposition pressure may be maintained at about 0.001-10 torr, and the deposition temperature may be maintained at about 50-400° C. The precursors may be heated before being fed into the ALD reactor.

In the present invention, GeTe, SbTe, GeSbTe (GST) films were deposited by ALD method. Scanning electron microscope (SEM), was used to obtain cross-sectional image and surface morphology of samples. The phase transition properties of samples and films were characterized by Energy Dispersive X-ray Analysis.

WORKING EXAMPLES AND EMBODIMENTS

Example 1

Synthesis of Bis(Trimethylsilyl)Tellurium 1.28 g (0.01 mol) 200 mesh tellurium powder, 0.48 g (0.02 mol) lithium hydride, and 40 ml tetrahydrofuran (THF) were placed in a 100 ml flask. With stirring, the mixture was refluxed for 4 hours. All black powder of tellurium disappeared, and a muddy color precipitate was formed. Then, the mixture was cooled down to −20° C.; 2.2 g (0.02 mol) trimethylchlorosilane was added. The mixture was allowed to warm up to room temperature. After stirring for 4 hours, the mixture was filtered under inert atmosphere. The solvent was removed by distillation. Bis(trimethylsilyl)tellurium was purified by vacuum distillation, b.p. 50° C. at 2.5 mm Hg.

Thermo-gravimetric analysis (TGA) and differential scanning calorimetry (DSC) are used to characterize Bis(trimethylsilyl)tellurium. The results were shown in FIG. 1. The compound is stable upon heating up to 120° C. It can be conveniently stored and handle at room temperature or with mild heating.

Example 2

Synthesis of Tetramethyldisilyltellurium 3.84 g (0.03 mol) 200 mesh tellurium powder, 1.44 g (0.06 mol) lithium hydride, and 40 ml tetrahydrofuran (THF) were placed in a 100 ml flask. With stirring, the mixture was refluxed for 4 hours. All black powder of tellurium disappeared, and a muddy color precipitate was formed. Then, the mixture was cooled down to −20° C.; 5.77 g (0.06 mol) dimethylchlorosilane was added. The mixture was allowed to warm up to room temperature. After stirring for 4 hours, the mixture was filtered under inert atmosphere. The solvent was removed by distillation. Tetramethyldisilyltellurium was purified by vacuum distillation, Boiling Point 50° C. at 4 mm Hg.

Example 3

Synthesis of Trimethylsilyl-t-butyltellurium 6.4 g (0.05 mol) 200 mesh tellurium powder, 100 ml diethyl ether, and 20 ml 2.5 M t-butyllithium in hexane were added to a 250 ml flask. At 0° C., the mixture was stirred for 8 hours. All black powder of tellurium disappeared, and a muddy color precipitate was formed. To this mixture, 5.4 g (0.05 mol) trimethylchlorosilane was added. The mixture was allowed to warm up to room temperature. After stirring for 1 hour, the mixture was filtered under inert atmosphere. The solvent was removed by distillation. Trimethylsilyl-t-butyl-tellurium was purified by vacuum distillation.

Example 4

Figure 2:
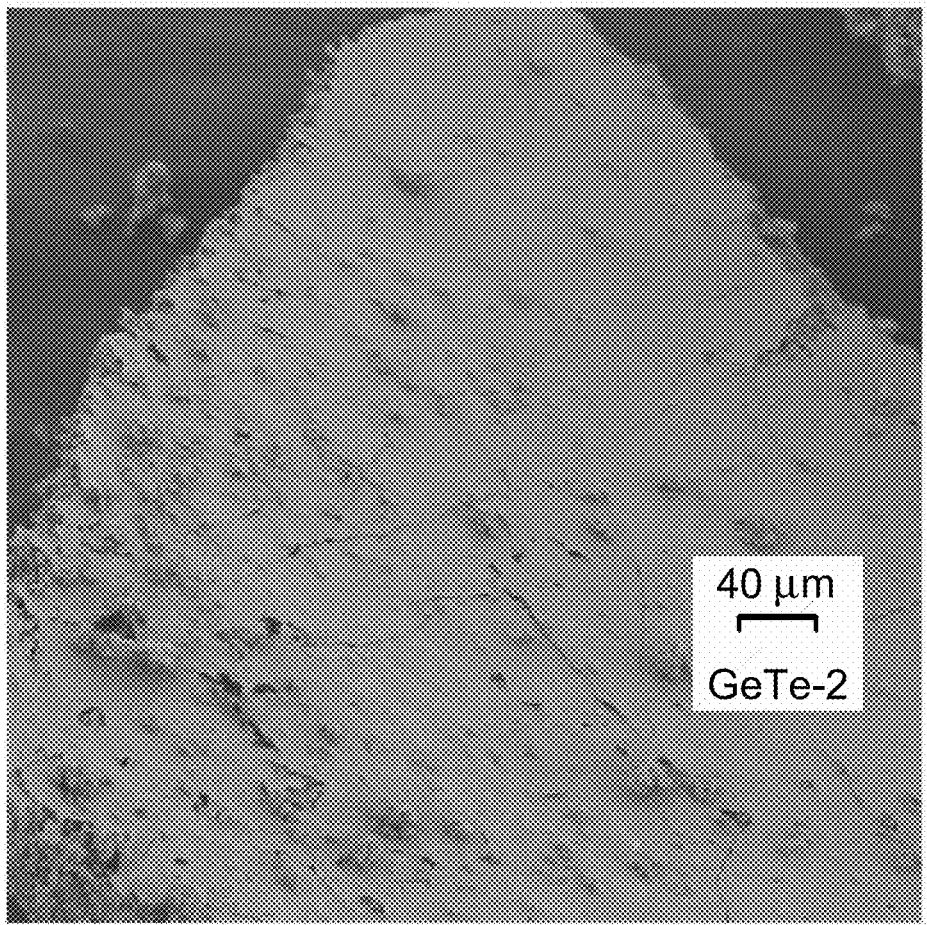
FIG. 2. Scanning Electron Microscopy (SEM) picture of SbTe sample.
Figure 3:
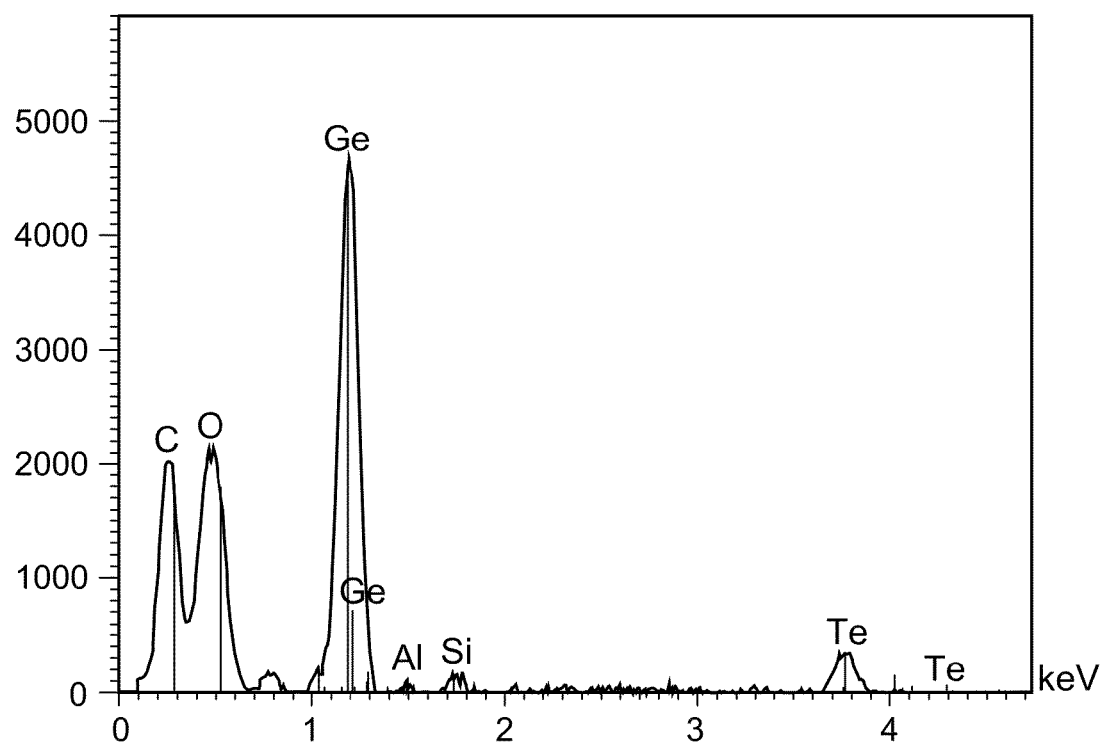
FIG. 3. Energy Dispersive X-ray Analysis (EDX) of SbTe sample.

Synthesis of Germanium Telluride Sample 0.27 g (0.001 mol) Bis(trimethylsilyl)tellurium was dissolved in 6 ml of acetonitrile. To the solution, 0.12 g tetramethoxygermane was added at room temperature. The reaction was exo-thermic. A black precipitate was formed immediately. The precipitate was filtered out and washed with THF, and dried in air. Energy Dispersive X-ray Analysis (EDX) in conjunction with Scanning Electron Microscopy (SEM) have been used to study the black solid precipitate. The results were shown in FIGS. 2 and 3. The results indicated that the black solid was a composition of germanium and tellurium. Germanium telluride is insoluble in organic solvents.

Example 5

Figure 4:
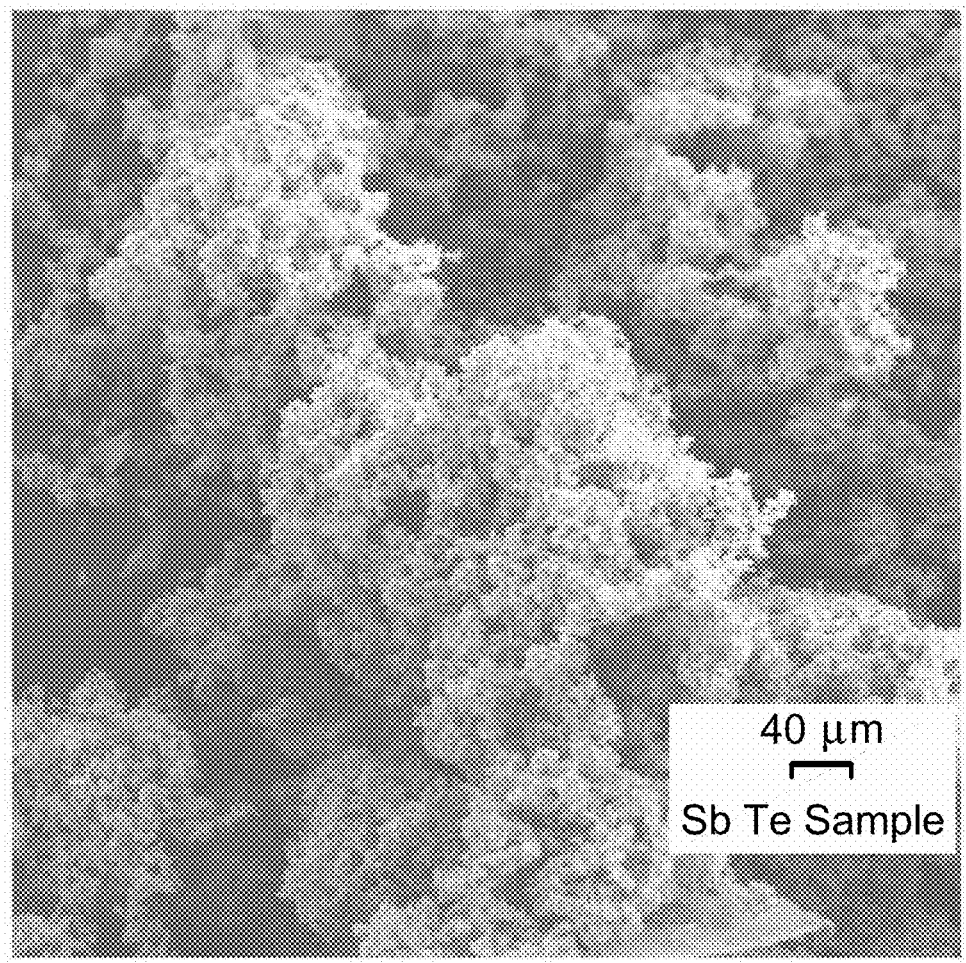
FIG. 4. Scanning Electron Microscopy (SEM) picture of GeTe sample.
Figure 5:
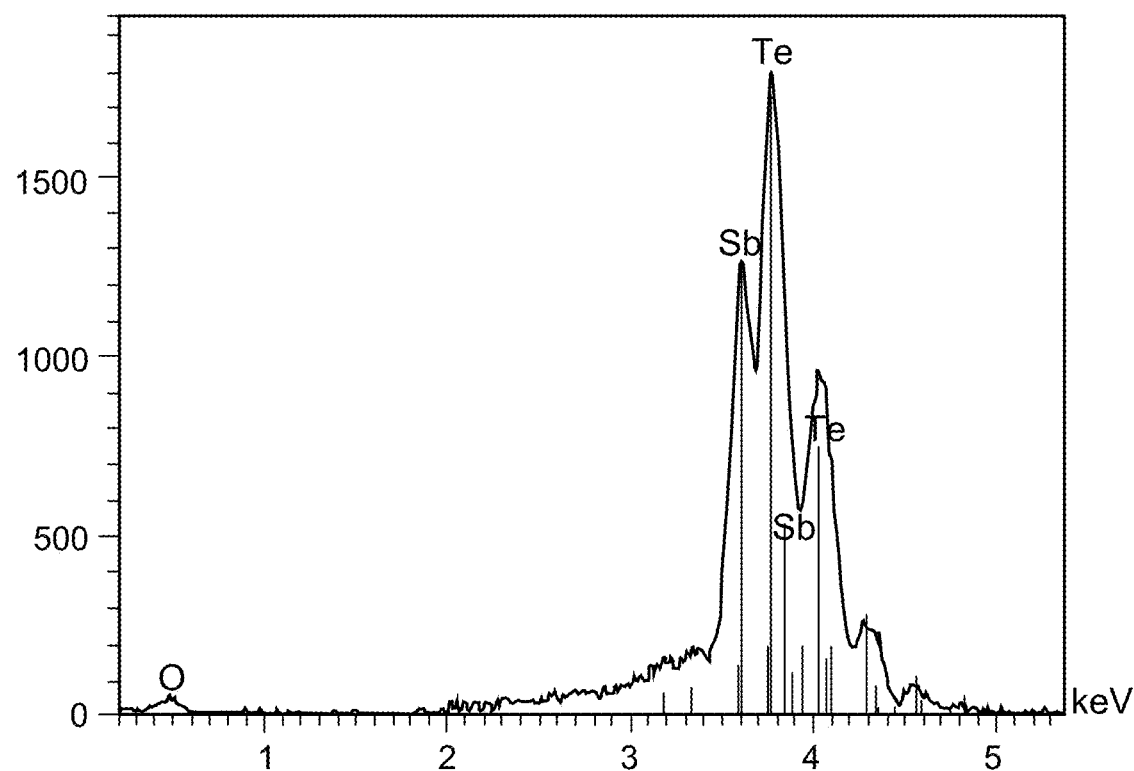
FIG. 5. Energy Dispersive X-ray Analysis (EDX) of GeTe sample.

Synthesis of Antimony Telluride Sample 0.27 g (0.001 mol) Bis(trimethylsilyl)tellurium was dissolved in 6 ml of acetonitrile. To the solution, 0.15 g triethoxyantimony was added at room temperature. The reaction was exo-thermic. A black precipitate was formed immediately. The precipitate was filtered out and washed with THF, and dried in air. Energy Dispersive X-ray Analysis (EDX) in conjunction with Scanning Electron Microscopy (SEM) have been used to study the black solid precipitate. The results were shown in FIGS. 4 and 5. The results indicated that the black solid was a composition of antimony and tellurium. Antimony telluride is insoluble in organic solvents.

Example 6

Figure 6:
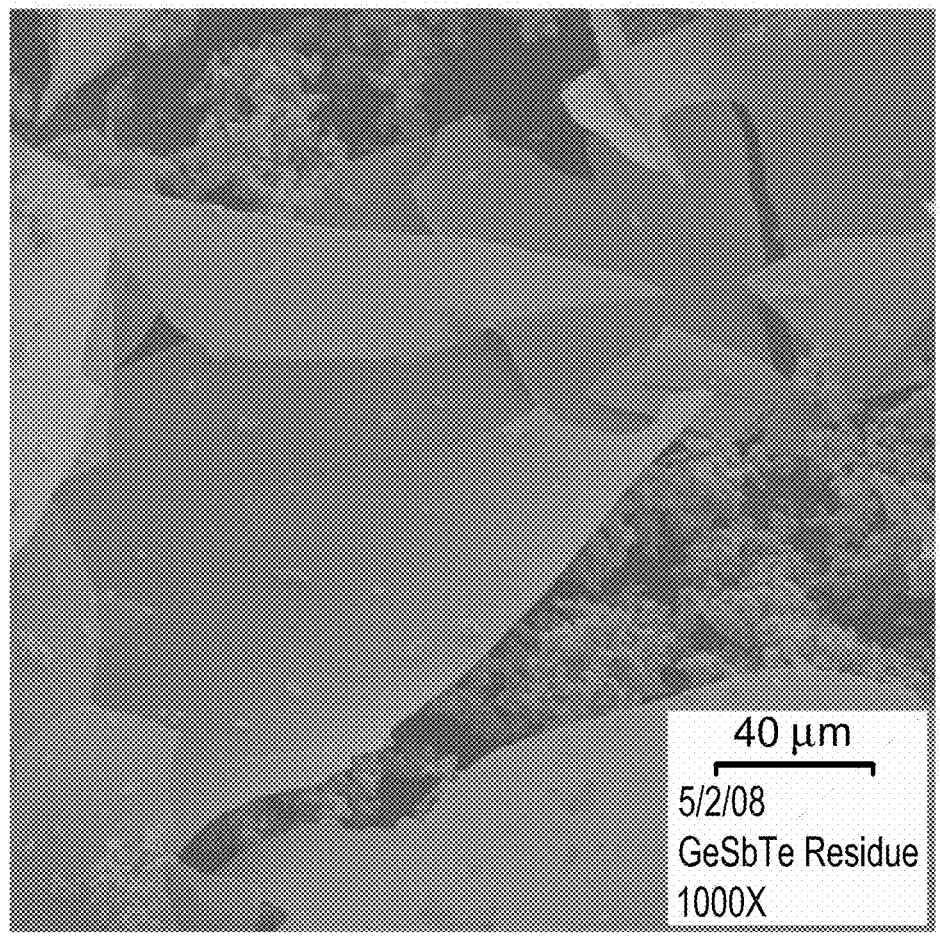
FIG. 6. Scanning Electron Microscopy (SEM) picture of GeSbTe sample.
Figure 7:
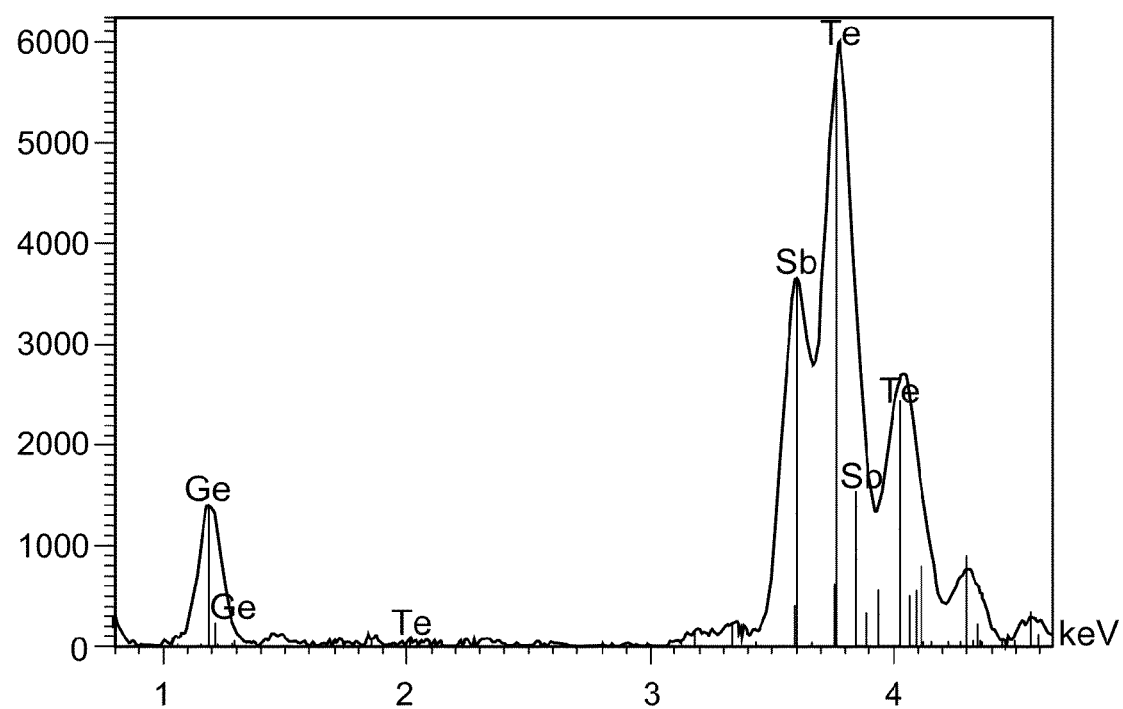
FIG. 7. Energy Dispersive X-ray Analysis (EDX) of GeSbTe ternary film.

Synthesis of GST Ternary Compound Sample 0.27 g (0.001 mol) Bis(trimethylsilyl)tellurium was dissolved in 6 ml of acetonitrile. To the solution, a solution of 0.10 g tetraethoxygermane and 0.10 g triethoxyantimony in 5 ml of acetonitrile was added at room temperature. A black precipitate was formed immediately. The precipitate was filtered out and washed with THF, and dried in air. Energy Dispersive X-ray Analysis (EDX) in conjunction with Scanning Electron Microscopy (SEM) have been used to study the black solid precipitate. The results were shown in FIGS. 6 and 7. The results indicated that the black solid was a composition of germanium, antimony, and tellurium. The GST material is insoluble in organic solvents.

Example 7

Formation of GeTe Film Using ALD Technique

Thin films of GeTe were deposited using atomic layer deposition (ALD) technique described in this invention. $Ge(OMe)_4$ and $(MeSi)_2Te$ were used as precursors to form GeTe films. Since TiN is typically used for metal contacts in GST memory cells, 100 nm TiN coated 4" Si (100) wafers by sputtering technique were chosen as the substrates for GeTe film deposition. The substrate was heated to 100° C. The precursors were heated before being fed into the reactor. Specifically, $Ge(OMe)_4$ was heated to 30° C., and $(MeSi)_2Te$ was heated to 50° C. The amount of each of these two precursors fed into reactor was then controlled by the duration when each precursor was fed into the reactor. The ALD sequence was as follows:
 (a) pulse $Ge(OMe)_4$ for 1 second,
 (b) purge the reactor with $N_2$ gas,
 (c) pulse $(MeSi)_2Te$ for 1 second
 (d) purge the reactor with $N_2$ gas,
 (e) repeat steps (a) to (d) for 1000 times (or 1000 cycles).

Figure 8:
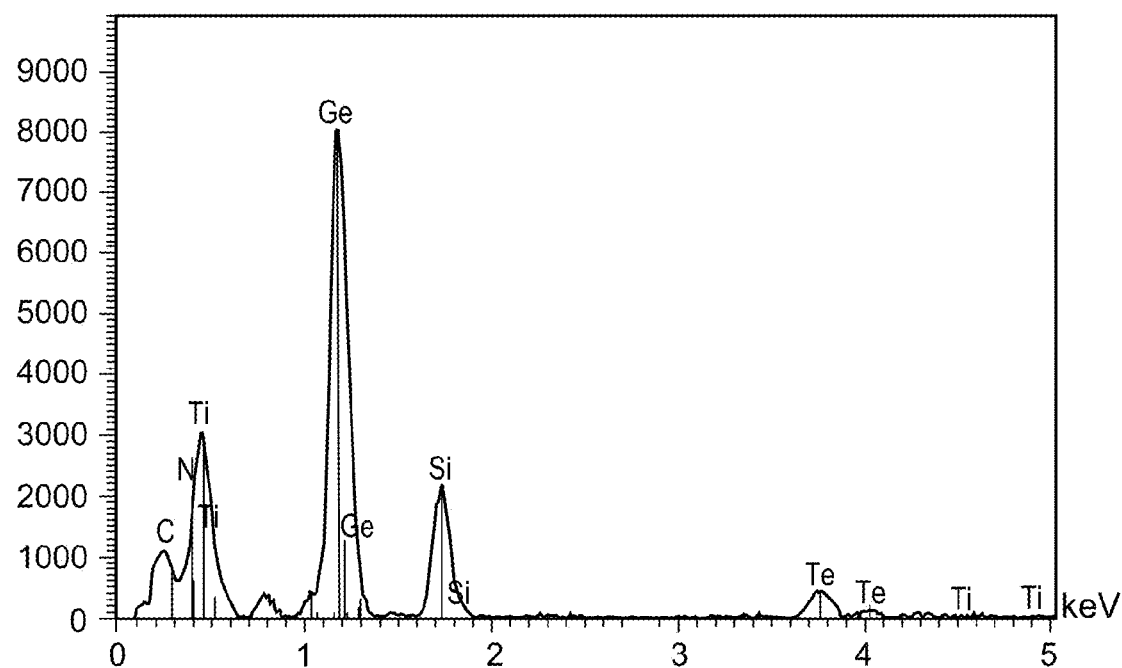
FIG. 8. Energy Dispersive X-ray Analysis (EDX) of an Atomic Layer Deposition (ALD) GeTe film.

After the deposition was complete, the film was inspected for its compositions using EDX. A typical EDX spectrum of the GeTe films is shown in FIG. 8. As can be seen from FIG. 8, both Ge and Te were present in the film. The Ti, N and Si peaks came from the Si substrate and TiN coating, while C was due to the SEM chamber contamination.

Example 8

Formation of SbTe Film Using ALD Technique

Thin films of SbTe were deposited using atomic layer deposition (ALD) technique described in this invention. $Sb(OEt)_3$ and $(MeSi)_2Te$ were used as precursors to form SbTe films. Since TiN is typically used for metal contacts in GST memory cells, 100 nm TiN coated 4" Si (100) wafers by sputtering technique were chosen as the substrates for SbTe film deposition. The substrate was heated to 100° C. The precursors were heated before being fed into the reactor. Specifically, $Sb(OEt)_3$ and $(MeSi)_2Te$ was heated to 30° C. and to 50° C., respectively. The amount of each of these two precursors fed into reactor was then controlled by the duration when each precursor was fed into the reactor. The ALD sequence was as follows:
 (a) pulse $Sb(OEt)_3$ for 1 second;
 (b) purge the reactor with $N_2$ gas;
 (c) pulse $(MeSi)_2Te$ for 1 second;
 (d) purge the reactor with $N_2$ gas;
 (e) repeat steps (a) to (d) for 1000 times (or 1000 cycles).

Figure 9:
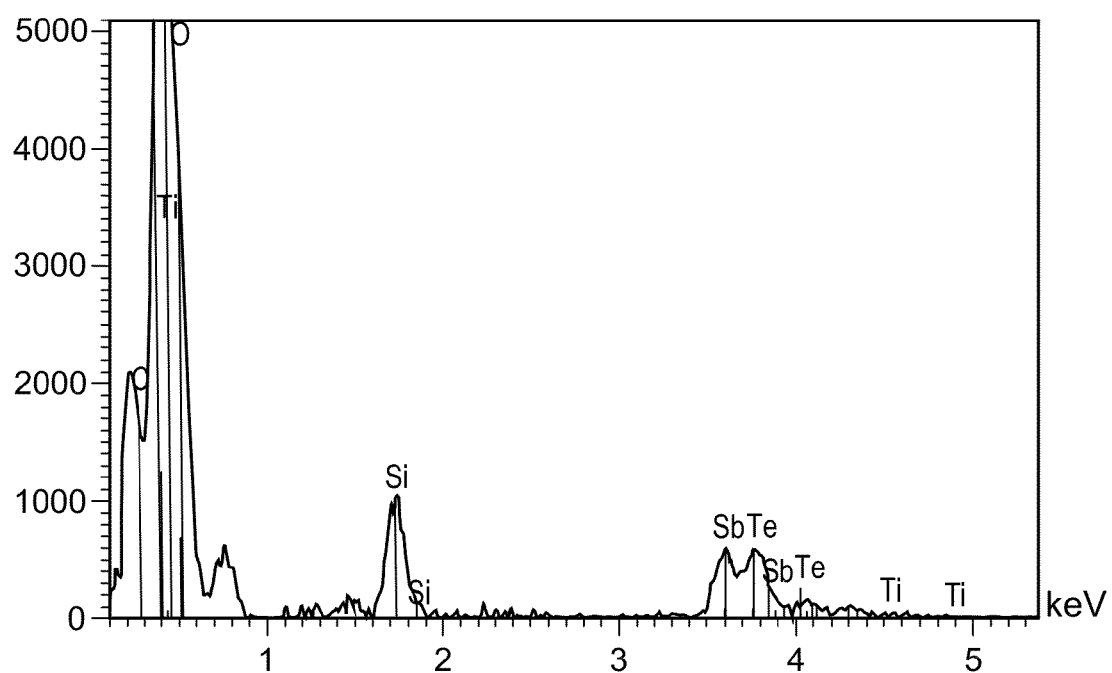
FIG. 9. Energy Dispersive X-ray Analysis (EDX) of an Atomic Layer Deposition (ALD) SbTe film.

After the deposition was complete, the film was inspected for its compositions using EDX. A typical EDX spectrum of SbTe films is shown in FIG. 9. As can be seen from FIG. 9, both Sb and Te were present in the film. The Ti, N and Si peaks came from the Si substrate and TiN coating, while C was due to the SEM chamber contamination.

Example 9

Formation of GeSbTe (GST) Film Using ALD Technique

Thin films of GeSbTe were deposited using atomic layer deposition (ALD) technique described in this invention. $Ge(OMe)_4$, $Sb(OEt)_3$ and $(MeSi)_2Te$ were used as precursors to form GeSbTe films. Since TiN is typically used for metal contacts in GST memory cells, 100 nm TiN coated 4" Si (100) wafers by sputtering technique were chosen as the substrates for SbTe film deposition. The substrate was heated to 100° C. The precursors were heated before being fed into the reactor. Specifically, both $Ge(OMe)_4$ and $Sb(OEt)_3$ were heated to 30° C., while $(MeSi)_2Te$ was heated to 50° C. The amount of each of these three precursors fed into reactor was then controlled by the duration when each precursor was fed into the reactor. The ALD sequence was as follows:
 (a) pulse $Sb(OEt)_3$ for 1 second;
 (b) purge the reactor with $N_2$ gas;
 (c) pulse $(MeSi)_2Te$ for 1 second;
 (d) purge the reactor with $N_2$ gas;
 (e) pulse $Ge(OMe)_4$ for 1 second;
 (f) purge the reactor with $N_2$ gas;
 (g) pulse $(MeSi)_2Te$ for 1 second;
 (h) purge the reactor with $N_2$ gas;
 (i) repeat steps (a) to (h) for 1000 times (or 1000 cycles).

Figure 10:
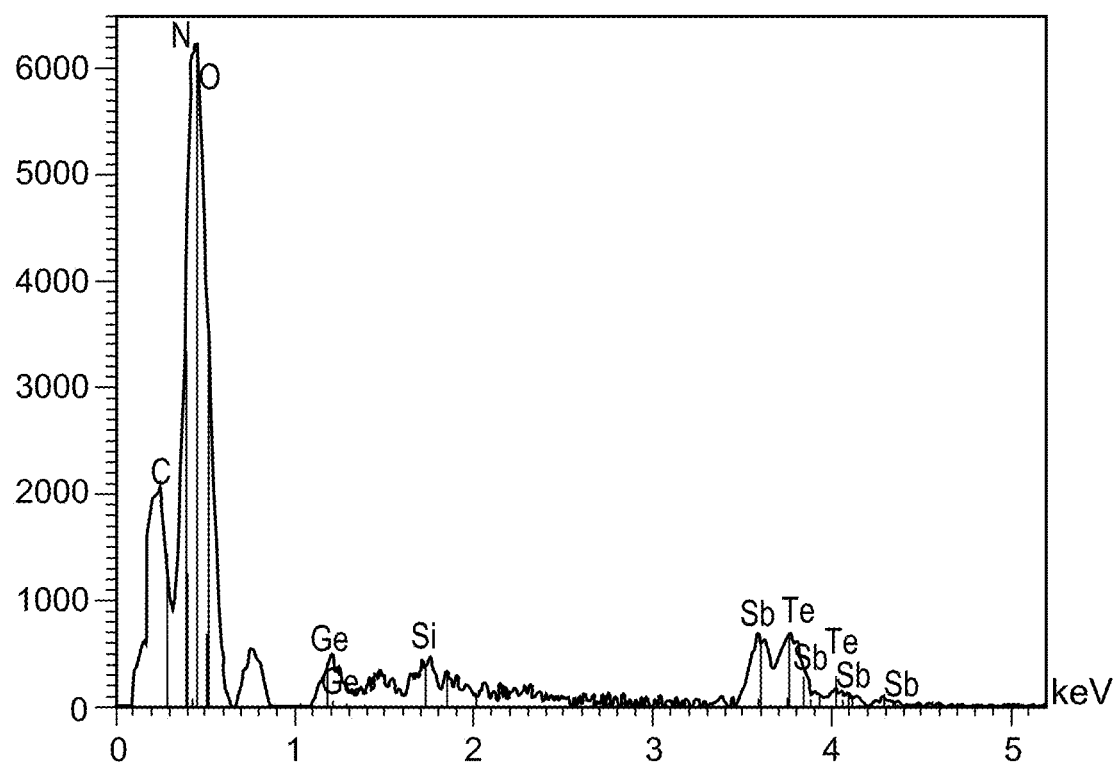
FIG. 10. Energy Dispersive X-ray Analysis (EDX) of an Atomic Layer Deposition (ALD) GeSbTe film.

After the deposition was complete, the film was inspected for its compositions using EDX. A typical EDX spectrum of the GST films is shown in FIG. 10. As can be seen from FIG. 10, Ge, Sb and Te were all present in the film. The Ti, N and Si peaks came from the Si substrate and TiN coating, while C was due to the SEM chamber contamination.

Embodiment 1

Deposition of GeTe Films Using CVD Technique

Deposition of GeTe film using Chemical Vapor Deposition (CVD) technique including the following steps:
 a) Substrates to be deposited films on are loaded to a CVD reactor;
 b) The reactor is purged with $N_2$ or Ar and pumped down to low pressure of less than 1 T and heated up to a temperature at which film deposition is performed (typically around 200° C.-400° C.);
 c) The reactor is then pumped down to a pressure of 500 mT;
 d) The precursor for Te, bis(trimethylsilyl)tellurium, and the precursor for Ge tetrakis(dimethylamino)germane are filled into separate containers connected to direct liquid injection (DLI) systems that are connected to the CVD reactor;
 e) The vapor of bis(trimethylsilyl)tellurium for Te, and the vapor of tetrakis(dimethylamino)germane for Ge are then introduced to the CVD reactor at fixed flow rates. The pressure in the reactor, however, is controlled and remains the constant at 500 mT;
 f) The CVD reaction for forming GeTe films occur and continue until the flows for Te and Ge stop;
 g) The CVD reactor is then purged with $N_2$ or Ar and cooled down to room temperature before the substrates deposited with GeTe films are removed from the reactor.

With the deposition chemistry, highly conformal GeTe films can be deposited on the surface of substrate materials such as silicon, silicon oxide, silicon nitride, titanium nitride.

Embodiment 2

Deposition of SbTe Films Using CVD Technique

Deposition of SbTe film using Chemical Vapor Deposition (CVD) technique including the following steps:
  a) Substrates to be deposited films on are loaded to a CVD reactor;
  b) The reactor is purged with $N_2$ or Ar and pumped down to low pressure of less than 1 T and heated up to a temperature at which film deposition is performed (typically around 200° C.-400° C.);
  c) The reactor is then pumped down to a pressure of 500 mT;
  d) The precursor for Te, bis(trimethylsilyl)tellurium, and precursor for Sb tris(dimethylamino)antimony are filled into separate containers connected to direct liquid injection (DLI) systems that are connected to the CVD reactor;
  e) The vapor of bis(trimethylsilyl)tellurium for Te, and the vapor of tris(dimethylamino)antimony for Sb are then introduced to the CVD reactor at fixed flow rates. The pressure in the reactor, however, is controlled and remains the constant at 500 mT;
  f) The CVD reaction for forming SbTe films occur and continue until the flows for Te and Sb stop;
  g) The CVD reactor is then purged with $N_2$ or Ar and cooled down to room temperature before the substrates deposited with GST films are removed from the reactor.

With the deposition chemistry, highly conformal SbTe films can be deposited on the surface of substrate materials such as silicon, silicon oxide, silicon nitride, titanium nitride.

Embodiment 3

Deposition of GeSbTe Films Using CVD Technique

Deposition of GST film using Chemical Vapor Deposition (CVD) technique including the following steps:
  a) Substrates to be deposited films on are loaded to a CVD reactor;
  b) The reactor is purged with $N_2$ or Ar and pumped down to low pressure of less than 1 T and heated up to a temperature at which film deposition is performed (typically around 200° C.-400° C.);
  c) The reactor is then pumped down to a pressure of 500 mT;
  d) The precursor for Te, bis(trimethylsilyl)tellurium, the precursor for Ge tetrakis(dimethylamino)germane, and precursor for Sb tris(dimethylamino)antimony are filled into separate containers connected to direct liquid injection (DLI) systems that are connected to the CVD reactor;
  e) The vapor of bis(trimethylsilyl)tellurium for Te, the vapor of tetrakis(dimethylamino)germane for Ge, and the vapor of tris(dimethylamino)antimony for Sb are then introduced to the CVD reactor at fixed flow rates. The pressure in the reactor, however, is controlled and remains the constant at 500 mT;
  f) The CVD reaction for forming GeSbTe films occur and continue until the flows for Te, Ge and Sb stop;
  g) The CVD reactor is then purged with $N_2$ or Ar and cooled down to room temperature before the substrates deposited with GST films are removed from the reactor.

With the deposition chemistry, highly conformal GeSbTe films can be deposited on the surface of substrate materials such as silicon, silicon oxide, silicon nitride, titanium nitride.

Embodiment 4

Deposition of GeSe Films Using ALD Technique

Deposition of GeSe film using atomic layer deposition (ALD) technique including the following steps:
  a) Substrates to be deposited films on are loaded to an ALD reactor;
  b) The reactor is purged with $N_2$ and pumped down to low pressure of less than 1 T and heated up to a temperature at which film deposition is performed;
  c) A fixed flow rate of the vapor of silylselenium compound as Se precursor is introduced to the reactor. The reactor is saturated with this vapor for a short fixed time (typical less than 5 seconds), and then pumped down to 1 torr, followed by purging with $N_2$;
  d) A fixed flow rate of the vapor of alkoxygermane compound as Ge precursor is introduced to the reactor. The reactor is saturated with this vapor for a short fixed time (typical less than 5 seconds), and then pumped down to 1 torr, followed by purging with $N_2$; and
  e) Repeat steps c) to f) until a desired thickness of the film is achieved.

With the deposition chemistry, highly conformal GeSe films can be deposited on the surface of substrate materials such as silicon, silicon oxide, silicon nitride, titanium nitride. The process temperature range could be from room temperature to 400° C.

Embodiment 5

Deposition of SbSe Films in Using ALD Technique

Deposition of SbSe film using atomic layer deposition (ALD) technique including the following steps:
  a) Substrates to be deposited films on are loaded to an ALD reactor;
  b) The reactor is purged with $N_2$ and pumped down to low pressure of less than 1 T and heated up to a temperature at which film deposition is performed;
  c) A fixed flow rate of the vapor of silylselenium compound as Se precursor is introduced to the reactor. The reactor is saturated with this vapor for a short fixed time (typical less than 5 seconds), and then pumped down to 1 torr, followed by purging with $N_2$;
  d) A fixed flow rate of the vapor of alkoxyantimony compound as Sb precursor is introduced to the reactor. The reactor is saturated with this vapor for a short fixed time (typical less than 5 seconds), and then pumped down to 1 torr, followed by purging with $N_2$; and
  e) Repeat steps c) to f) until a desired thickness of the film is achieved.

With the deposition chemistry, highly conformal SbSe films can be deposited on the surface of substrate materials such as silicon, silicon oxide, silicon nitride, titanium nitride. The process temperature range could be from room temperature to 400° C.

Embodiment 6

Deposition of GeSbSe Films Using ALD Technique

Deposition of GeSbSe film using atomic layer deposition (ALD) technique including the following steps:

a) Substrates to be deposited films on are loaded to an ALD reactor;
b) The reactor is purged with $N_2$ and pumped down to low pressure of less than 1 T and heated up to a temperature at which film deposition is performed;
c) A fixed flow rate of the vapor of silylselenium compound as Se precursor is introduced to the reactor. The reactor is saturated with this vapor for a short fixed time (typical less than 5 seconds), and then pumped down to 1 torr, followed by purging with $N_2$;
d) A fixed flow rate of the vapor of alkoxygermane compound as Ge precursor is introduced to the reactor. The reactor is saturated with this vapor for a short fixed time (typical less than 5 seconds), and then pumped down to 1 torr, followed by purging with $N_2$;
e) A fixed flow rate of the vapor of silylselenium compound as Se precursor is introduced to the reactor. The reactor is saturated with this vapor for a short fixed time (typical less than 5 seconds), and then pumped down to 1 torr, followed by purging with $N_2$;
f) A fixed flow rate of the vapor of alkoxyantimony compound as Sb precursor is introduced to the reactor. The reactor is saturated with this vapor for a short fixed time (typical less than 5 seconds), and then pumped down to 1 torr, followed by purging with $N_2$; and
g) Repeat steps c) to f) until a desired thickness of the film is achieved.

With the deposition chemistry, highly conformal GeSbSe films can be deposited on the surface of substrate materials such as silicon, silicon oxide, silicon nitride, titanium nitride. The process temperature range could be from room temperature to 400° C.

Embodiment 7

Deposition of GeSe Films Using CVD Technique

Deposition of GeSe film using Chemical Vapor Deposition (CVD) technique including the following steps:
a) Substrates to be deposited films on are loaded to a CVD reactor;
b) The reactor is purged with $N_2$ or Ar and pumped down to low pressure of less than 1 T and heated up to a temperature at which film deposition is performed (typically around 200° C.-400° C.);
c) The reactor is then pumped down to a pressure of 500 mT;
d) The precursor for Se, silylselenium, and the precursor for Ge tetrakis(dimethylamino)germane are filled into separate containers connected to direct liquid injection (DLI) systems that are connected to the CVD reactor;
e) The vapor of silylselenium for Se, and the vapor of tetrakis(dimethylamino)germane for Ge are then introduced at fixed flow rates to the CVD reactor. The pressure in the reactor, however, is controlled and remains the constant at 500 mT;
f) The CVD reaction for forming GeSbSe films occur and continue until the flows for Ge and Se stop;
g) The CVD reactor is then purged with $N_2$ or Ar and cooled down to room temperature before the substrates deposited with GeSbSe films are removed from the reactor.

With the deposition chemistry, highly conformal GeSe films can be deposited on the surface of substrate materials such as silicon, silicon oxide, silicon nitride, titanium nitride.

Embodiment 8

Deposition of SbSe Films Using CVD Technique

Deposition of SbSe film using Chemical Vapor Deposition (CVD) technique including the following steps:
a) Substrates to be deposited films on are loaded to a CVD reactor;
b) The reactor is purged with $N_2$ or Ar and pumped down to low pressure of less than 1 T and heated up to a temperature at which film deposition is performed (typically around 200° C.-400° C.);
c) The reactor is then pumped down to a pressure of 500 mT;
d) The precursor for Se, silylselenium, and precursor for Sb tris(dimethylamino)antimony are filled into separate containers connected to direct liquid injection (DLI) systems that are connected to the CVD reactor;
e) The vapor of silylselenium for Se, and the vapor of tris(dimethylamino)antimony for Sb are then introduced at fixed flow rates to the CVD reactor. The pressure in the reactor, however, is controlled and remains the constant at 500 mT;
f) The CVD reaction for forming SbSe films occur and continue until the flows for Se and Sb stop;
g) The CVD reactor is then purged with $N_2$ or Ar and cooled down to room temperature before the substrates deposited with GeSbSe films are removed from the reactor.

With the deposition chemistry, highly conformal SbSe films can be deposited on the surface of substrate materials such as silicon, silicon oxide, silicon nitride, titanium nitride.

Embodiment 9

Deposition of GeSbSe Films Using CVD Technique

Deposition of GeSbSe film using Chemical Vapor Deposition (CVD) technique including the following steps:
a) Substrates to be deposited films on are loaded to a CVD reactor;
b) The reactor is purged with $N_2$ or Ar and pumped down to low pressure of less than 1 T and heated up to a temperature at which film deposition is performed (typically around 200° C.-400° C.);
c) The reactor is then pumped down to a pressure of 500 mT;
d) The precursor for Se, silylselenium, the precursor for Ge tetrakis(dimethylamino)germane, and precursor for Sb tris(dimethylamino)antimony are filled into separate containers connected to direct liquid injection (DLI) systems that are connected to the CVD reactor;
e) The vapor of silylselenium for Se, the vapor of tetrakis(dimethylamino)germane for Ge, and the vapor of tris(dimethylamino)antimony for Sb are then introduced at fixed flow rates to the CVD reactor. The pressure in the reactor, however, is controlled and remains the constant at 500 mT;
f) The CVD reaction for forming GeSbSe films occur and continue until the flows for Te, Ge and Sb stop;
g) The CVD reactor is then purged with $N_2$ or Ar and cooled down to room temperature before the substrates deposited with GeSbSe films are removed from the reactor.

With the deposition chemistry, highly conformal GeSbSe films can be deposited on the surface of substrate materials such as silicon, silicon oxide, silicon nitride, titanium nitride.

While the invention has been described in detail and with reference to specific examples and the embodiments thereof, it will be apparent to one skilled in the art that various changes and modifications can be made therein without departing from the spirit and scope thereof.

The invention claimed is:

1. A process of making a ternary metal chalcogenide alloy film on a substrate comprising steps of:
   (a) contacting the substrate with a silyl-chalcogen selected from the group consisting of silyltellurium and silylselenium;
   (b) contacting the substrate with at least one germanium compound selected from the group consisting of $GeX_4$, wherein X is a neucleophilic group selected from the group consisting of OR (alkoxy), CN (cyano), OCN (cyanate), SCN (thiocyanate), carboxylic groups and mixtures thereof; $(R^1O)_4Ge$ or $(R^1O)_nGeH_{4-n}$, where $R^1$ is an alkyl group with 1 to 10 carbons in chain, branched, cyclic, or aromatic group; and n=1 to 3; and $R_nGeX'_{4-n}$, wherein X' is F (fluorine), Cl (chlorine), or Br (bromine); R is hydrogen, or alkyl groups with 1 to 10 carbons in chain, branched, cyclic or aromatic groups; and n=0-3; and
   (c) contacting the substrate with a metal compound having a general formula of: $M'X_n$ wherein M' is selected from the group consisting of Sb, In, Sn, Ga, Bi, Ag, Cu, Zr, Hf, Hg, Cd, and Zn;
   X is a neucleophilic group selected from the group consisting of OR (alkoxy), F (fluorine), Cl (chlorine), Br (bromine), CN (cyano), OCN (cyanate), SCN (thiocyanate), diketonate, carboxylic groups and mixtures thereof; and n=1 to 5.

2. The process of claim 1 wherein
   the silyltellurium is selected from the group consisting of disilyltellutium having a general formula: $(R^1R^2R^3Si)_2Te$, alkylsilyltellurium having a general formula: $(R^1R^2R^3Si)TeR^4$, and mixtures thereof;
       wherein $R^1$, $R^2$, $R^3$, and $R^4$ are independently hydrogen, alkyl groups having 1-10 carbons in linear, branched, or cyclic forms without or with double bonds, or aromatic groups; and
   the silylselenium is selected from the group consisting of disilylselenium having a general formula: $(R^1R^2R^3Si)_2Se$, alkylsilylselenium having a general formula: $(R^1R^2R^3Si)SeR^4$, and mixtures thereof;
       wherein $R^1$, $R^2$, $R^3$, and $R^4$, are independently hydrogen, alkyl groups having 1-10 carbons in linear, branched, or cyclic forms without or with double bonds, or aromatic groups.

3. The process of claim 2 wherein
   the silyltellurium is selected from the group consisting of bis(trimethylsilyl)tellurium, bis(dimethylsilyl)tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium; and the silylselenium is selected from the group consisting of bis(trimethylsilyl)selenium, bis(dimethylsilyl)selenium, bis(triethylsilyl)selenium, bis(diethylsilyl)selenium, bis(phenyldimethylsilyl)selenium, bis(t-butyldimethylsilyl)selenium, dimethylsilylmethyl selenium, dimethylsilylphenyl selenium, dimethylsilyl-n-butyl selenium, dimethylsilyl-t-butyl selenium, trimethylsilylmethyl selenium, trimethylsilylphenyl selenium, trimethylsilyl-n-butyl selenium, and trimethylsilyl-t-butylselenium.

4. The process of claim 1 wherein the germanium compound is selected from the group consisting of:
   $(R^1O)_4Ge$ or $(R^1O)_nGeH_{4-n}$, where $R^1$ is an alkyl group with 1 to 10 carbons in chain, branched, cyclic, or aromatic group; and n=1 to 3.

5. The process of claim 1 wherein the process is selected from the group consisting of atomic layer deposition (ALD) process, Chemical Vapor Deposition (CVD) process and solution wet chemistry.

6. The process of claim 1, wherein the process is an atomic layer deposition (ALD) in an ALD reactor, and the process further comprising a step of: purging the ALD reactor with inert gas selected from the group consisting of $N_2$, Ar and mixtures thereof;
   wherein the purging step is performed before the contacting step (a) and after each contacting step.

7. The process of claim 1, wherein the process is a Chemical Vapor Deposition (CVD) in a CVD reactor, and the process further comprising steps of:
   purging the CVD reactor with inert gas selected from the group consisting of $N_2$, Ar and mixtures thereof; and
   pumping the CVD reactor down to a pressure of less than 1 Torr; wherein the purging and pumping steps are performed before the contacting step (a).

8. The CVD process of claim 7, wherein the CVD is a cyclic-CVD; and all steps are repeated to achieve a desired thickness of the film.

9. An ALD process of making a ternary metal chalcogenide alloy film on a substrate in an ALD reactor comprising steps of:
   (a) contacting the substrate with a silyl-chalcogen selected from the group consisting of silyltellurium and silylselenium;
   (b) contacting the substrate with at least one germanium compound selected from the group consisting of $GeX_4$, wherein X is a neucleophilic group selected from the group consisting of OR (alkoxy), CN (cyano), OCN (cyanate), SCN (thiocyanate), carboxylic groups and mixtures thereof; $(R^1O)_4Ge$ or $(R^1O)_nGeH_{4-n}$, where $R^1$ is an alkyl group with 1 to 10 carbons in chain, branched, cyclic, or aromatic group; and n=1 to 3; and $R_nGeX'_{4-n}$, wherein X' is F (fluorine), Cl (chlorine), or Br (bromine); R is hydrogen, or alkyl groups with 1 to 10 carbons in chain, branched, cyclic or aromatic groups; and n=0-3;
   (c) contacting the substrate with a silyl-chalcogen selected from the group consisting of silyltellurium and silylselenium;
   (d) contacting the substrate with a metal compound having a general formula of: $M'X_n$;
   wherein: M' is selected from the group consisting of Sb, In, Sn, Ga, Bi, Ag, Cu, Zr, Hf, Hg, Cd, and Zn; X is a neucleophilic group selected from the group consisting of OR (alkoxy), F (fluorine), Cl (chlorine), Br (bromine), CN (cyano), OCN (cyanate), SCN (thiocyanate), diketonate, carboxylic groups and mixtures thereof; and n=1 to 5; and
(e) purging the ALD reactor with inert gas selected from the group consisting of $N_2$, Ar and mixtures thereof;
wherein the purging step (e) is performed before the contacting step (a) and after each contacting step; and
all steps are repeated to achieve a desired thickness of the film.

10. The ALD process of claim 9 wherein
the germanium compound is selected from the group consisting of:
$(R^1O)_4Ge$ or $(R^1O)_nGeH_{4-n}$, where $R^1$ is an alkyl group with 1 to 10 carbons in chain, branched, cyclic, or aromatic group; and n=1 to 3;
$M'X_n$ is selected from the group consisting of:
(1) $(RO)_3Sb$, where R is an alkyl group with 1 to 10 carbons in chain, branched, cyclic, or aromatic group;
(2) antimony halide with the general formula: $SbX_3$ and $SbX_5$, where X is F, Cl, or Br.

11. The ALD process of claim 9 wherein
the silyltellurium is selected from the group consisting of disilyltellutium having a general formula: $(R^1R^2R^3Si)_2Te$,
alkylsilyltellurium having a general formula: $(R^1R^2R^3Si)TeR^4$, and
mixtures thereof;
wherein $R^1, R^2, R^3$, and $R^4$, are independently hydrogen, alkyl groups having 1-10 carbons in linear, branched, or cyclic forms without or with double bonds, or aromatic groups; and
the silylselenium is selected from the group consisting of disilylselenium having a general formula: $(R^1R^2R^3Si)_2Se$,
alkylsilylselenium having a general formula: $(R^1R^2R^3Si)SeR^4$, and
mixtures thereof;
wherein $R^1, R^2, R^3$, and $R^4$, are independently hydrogen, alkyl groups having 1-10 carbons in linear, branched, or cyclic forms without or with double bonds, or aromatic groups.

12. The ALD process of claim 11, wherein
the silyltellurium is selected from the group consisting of bis(trimethylsilyl)tellurium, bis(dimethylsilyl)tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium; and the silylselenium is selected from the group consisting of bis(trimethylsilyl)selenium, bis(dimethylsilyl)selenium, bis(triethylsilyl)selenium, bis(diethylsilyl)selenium, bis(phenyldimethylsilyl) selenium, bis(t-butyldimethylsilyl)selenium, dimethylsilylmethyl selenium, dimethylsilylphenyl selenium, dimethylsilyl-n-butyl selenium, dimethylsilyl-t-butyl selenium, trimethylsilylmethyl selenium, trimethylsilylphenyl selenium, trimethylsilyl-n-butyl selenium, and trimethylsilyl-t-butylselenium.

13. The ALD process of claim 9, wherein the silyl-chalcogen is bis(trimethylsilyl)tellurium, the germanium compound is alkoxygermane, and $M'X_n$ is alkoxyantimony.

14. The ALD process of claim 9 wherein deposition temperature ranges from 50° to 400° C.

15. The ALD process of claim 9 wherein $M'X_n$ is $(RO)_3Sb$, where R is an alkyl group with 1 to 10 carbons in chain, branched, cyclic, or aromatic group; and
the germanium compound is selected from the group consisting of:
$(R^1O)_4Ge$ or $(R^1O)_nGeH_{4-n}$, where $R^1$ is an alkyl group with 1 to 10 carbons in chain, branched, cyclic, or aromatic group; and n=1 to 3;
$GeX_4$, or $R_nGeX_{4-n}$, where X is F, Cl, or Br, R is hydrogen, or alkyl groups with 1 to 10 carbons in chain, branched, cyclic, or aromatic group; and n=0-3.

16. A CVD process of making a ternary metal chalcogenide alloy film on a substrate in an CVD reactor comprising steps of:
(a) contacting the substrate with a silyl-chalcogen selected from the group consisting of silyltellurium and silylselenium; and
(b) contacting the substrate with at least one germanium compound selected from the group consisting of $GeX_4$, X is a neucleophilic group selected from the group consisting of OR (alkoxy), CN (cyano), OCN (cyanate), SCN (thiocyanate), carboxylic groups and mixtures thereof; $(R^1O)_4Ge$ or $(R^1O)_nGeH_{4-n}$, where $R^1$ is an alkyl group with 1 to 10 carbons in chain, branched, cyclic, or aromatic group; and n=1 to 3;
and $R_nGeX'_{4-n}$, wherein X' is F (fluorine), Cl (chlorine), or Br (bromine); R is hydrogen, or alkyl groups with 1 to 10 carbons in chain, branched, cyclic or aromatic groups; and n=0-3;
(c) contacting the substrate with a metal compound having a general formula of: $M'X_n$;
wherein: M' is selected from the group consisting of Sb, In, Sn, Ga, Bi, Ag, Cu, Zr, Hf, Hg, Cd, and Zn; X is a neucleophilic group selected from the group consisting of OR (alkoxy), F (fluorine), Cl (chlorine), Br (bromine), CN (cyano), OCN (cyanate), SCN (thiocyanate), diketonate, carboxylic groups and mixtures thereof; and n=1 to 5;
(d) purging the CVD reactor with inert gas selected from the group consisting of $N_2$, Ar and mixtures thereof; and
(e) pumping the CVD reactor down to a pressure of less than 1 Torr;
wherein the purging and pumping steps (d) and (e) are performed before the contacting step (a).

17. The CVD process of claim 16, wherein the contacting steps are carried out sequentially or concurrently.

18. The CVD process of claim 16 wherein
the germanium compound is selected from the group consisting of:
$(R^1O)_4Ge$ or $(R^1O)_nGeH_{4-n}$, where $R^1$ is an alkyl group with 1 to 10 carbons in chain, branched, cyclic, or aromatic group; and n=1 to 3; and
$M'X_n$ is selected from the group consisting of:
(1) $(RO)_3Sb$, where R is an alkyl group with 1 to 10 carbons in chain, branched, cyclic, or aromatic group;
(2) antimony halide with the general formula: $SbX_3$ and $SbX_5$, where X is F, Cl, or Br.

19. The CVD process of claim 16 wherein
the silyltellurium is selected from the group consisting of:
disilyltellutium having a general formula: $(R^1R^2R^3Si)_2Te$, alkylsilyltellurium having a general formula: $(R^1R^2R^3Si)TeR^4$, and mixtures thereof;

wherein $R^1$, $R^2$, $R^3$, and $R^4$, are independently hydrogen, alkyl groups having 1-10 carbons in linear, branched, or cyclic forms without or with double bonds, or aromatic groups; and the silylselenium is selected from the group consisting of:
disilylselenium having a general formula: $(R^1R^2R^3Si)_2Se$, alkylsilylselenium having a general formula: $(R^1R^2R^3Si)SeR^4$, and mixtures thereof;

wherein $R^1$, $R^2$, $R^3$, and $R^4$, are independently hydrogen, alkyl groups having 1-10 carbons in linear, branched, or cyclic forms without or with double bonds, or aromatic groups.

20. The CVD process of claim 19, wherein the silyltellurium is selected from the group consisting of: bis(trimethylsilyl)tellurium, bis(dimethylsilyl)tellurium, bis(triethylsilyl)tellurium, bis(diethylsilyl)tellurium, bis(phenyldimethylsilyl)tellurium, bis(t-butyldimethylsilyl)tellurium, dimethylsilylmethyltellurium, dimethylsilylphenyltellurium, dimethylsilyl-n-butyltellurium, dimethylsilyl-t-butyltellurium, trimethylsilylmethyltellurium, trimethylsilylphenyltellurium, trimethylsilyl-n-butyltellurium, and trimethylsilyl-t-butyltellurium; and the silylselenium is selected from the group consisting of bis(trimethylsilyl)selenium, bis(dimethylsilyl)selenium, bis(triethylsilyl)selenium, bis(diethylsilyl)selenium, bis(phenyldimethylsilyl)selenium, bis(t-butyldimethylsilyl)selenium, dimethylsilylmethyl selenium, dimethylsilylphenyl selenium, dimethylsilyl-n-butyl selenium, dimethylsilyl-t-butyl selenium, trimethylsilylmethyl selenium, trimethylsilylphenyl selenium, trimethylsilyl-n-butyl selenium, and trimethylsilyl-t-butylselenium.

21. The CVD process of claim 16, wherein the silyl-chalcogen is bis(trimethylsilyl)tellurium, the germanium compound is alkoxygermane, and $M'X_n$ is alkoxyantimony.

22. The process of claim 16, wherein the CVD is a cyclic-CVD; and all steps are repeated to achieve a desired thickness of the film.

23. The CVD process of claim 16 wherein $M'X_n$ is $(RO)_3Sb$, where R is an alkyl group with 1 to 10 carbons in chain, branched, cyclic, or aromatic group; and n=1 to 3;

the germanium compound is selected from the group consisting of:

$(R^1O)_4Ge$ or $(R^1O)_nGeH_{4-n}$, where $R^1$ is an alkyl group with 1 to 10 carbons in chain, branched, cyclic, or aromatic group; and n=1 to 3; and $GeX_4$, or $R_nGeX_{4-n}$ where X is F, Cl, or Br, R is hydrogen, or alkyl groups with 1 to 10 carbons in chain, branched, cyclic, or aromatic group; and n=0-3.

24. A process of making a metal chalcogenide alloy film on a substrate comprising steps of:

(a) contacting the substrate with a silyl-chalcogen selected from the group consisting of silyltellurium and silylselenium;

(b) contacting the substrate with at least one metal compound selected from the group consisting of:

$(R^1O)_4Ge$ or $(R^1O)_nGeH_{4-n}$, where $R^1$ is an alkyl group with 1 to 10 carbons in chain, branched, cyclic, or aromatic group; and n=1 to 3; and $R_nGeX'_{4-n}$;

wherein X' is F (fluorine), Cl (chlorine), or Br (bromine); R is hydrogen, or alkyl groups with 1 to 10 carbons in chain, branched, cyclic or aromatic groups; and n=0-3; and (c) contacting the substrate with a metal compound having a general formula of: $M'X_n$ selected from the group consisting of:

$(RO)_3Sb$, where R is an alkyl group with 1 to 10 carbons in chain, branched, cyclic, or aromatic group; and antimony halide with the general formula: $SbX_3$ and $SbX_5$, where X is F, Cl, or Br.

* * * * *